United States Patent [19]
Benjamin

[11] 3,936,864
[45] Feb. 3, 1976

[54] MICROWAVE TRANSISTOR PACKAGE

[75] Inventor: James A. Benjamin, Boxford, Mass.

[73] Assignee: Raytheon Company, Lexington, Mass.

[22] Filed: Oct. 4, 1974

[21] Appl. No.: 512,829

Related U.S. Application Data

[63] Continuation of Ser. No. 361,731, May 18, 1973, abandoned.

[52] U.S. Cl. ..................... 357/74; 357/72; 357/81; 333/84 M; 174/52 S
[51] Int. Cl.² .................... H01L 23/02; H01L 23/12
[58] Field of Search ........ 357/74, 72, 81; 333/84 M; 174/52 S

[56] References Cited
UNITED STATES PATENTS

| | | | |
|---|---|---|---|
| 3,500,066 | 3/1970 | Pritchett | 357/74 |
| 3,626,259 | 12/1971 | Garboushian | 357/74 |
| 3,651,434 | 3/1972 | McGeough | 357/74 |
| 3,681,513 | 8/1972 | Hargis | 357/74 |
| 3,801,938 | 4/1974 | Goshgarian | 357/74 |
| 3,825,805 | 7/1974 | Belohoubeck | 357/74 |

*Primary Examiner*—Andrew J. James
*Attorney, Agent, or Firm*—John R. Inge; Joseph D. Pannone; Milton D. Bartlett

[57] ABSTRACT

A microwave transistor package which will accommodate large transistor chips as well as provide sufficient space for the addition of tuning capacitors or other circuits. The lead length inside of the package is minimized. A ceramic mounting pad is brazed to an underlying copper base and a nickel aperture plate is mounted around the mounting pad. The amount of ceramic material used is much less than in prior art devices. Tuning capacitors or other devices are mounted upon the top surface nickel spacer and connected to the transistor chip. In the preferred embodiment, the entire package is hermetically sealed.

10 Claims, 7 Drawing Figures

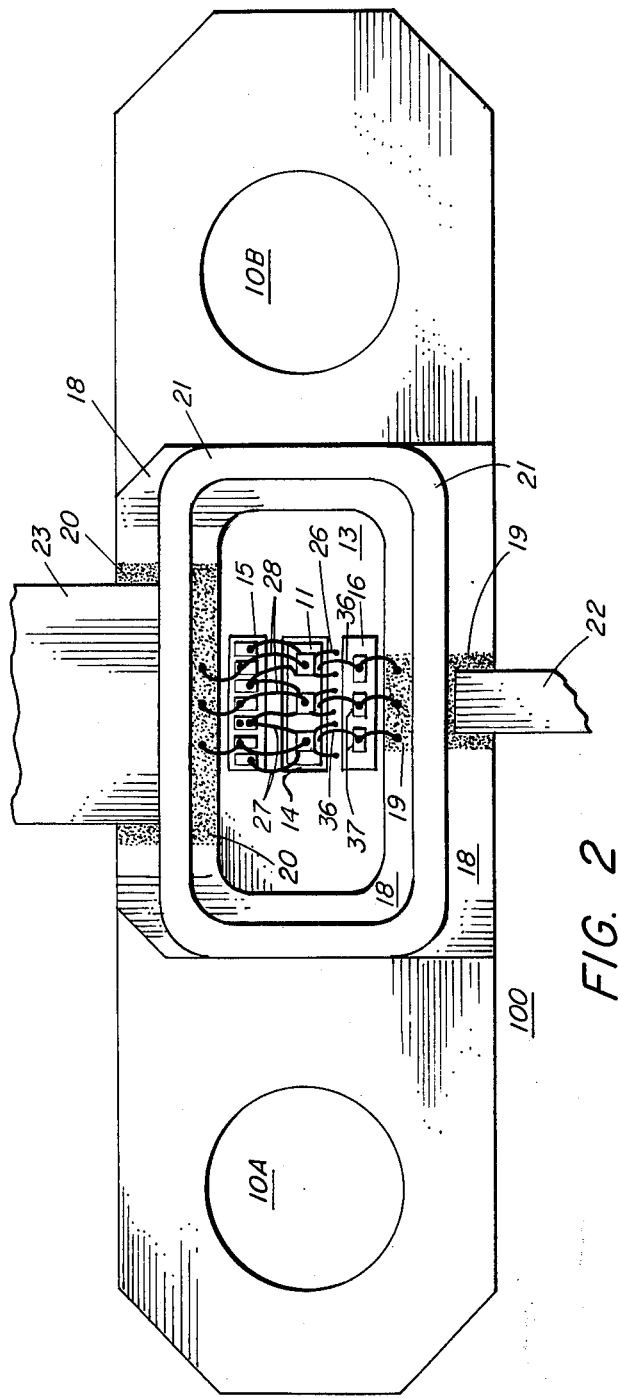
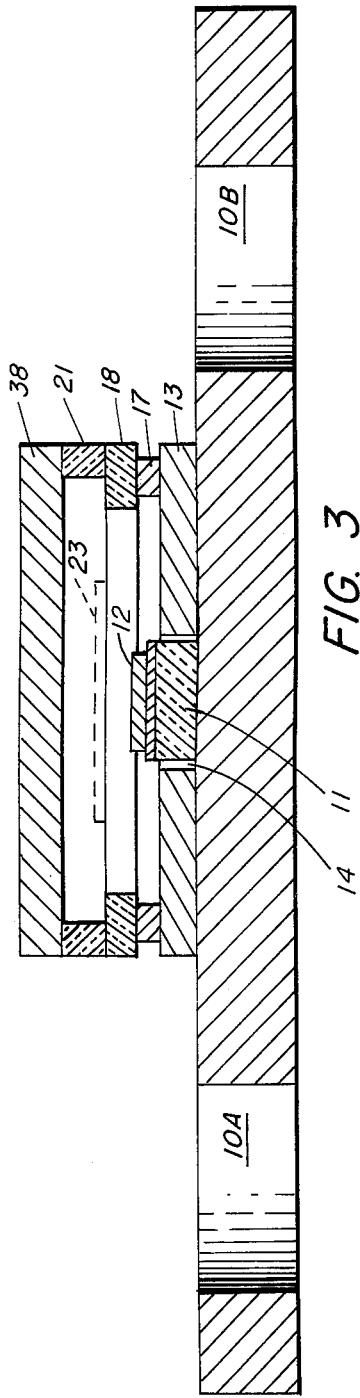
FIG. 2
FIG. 3

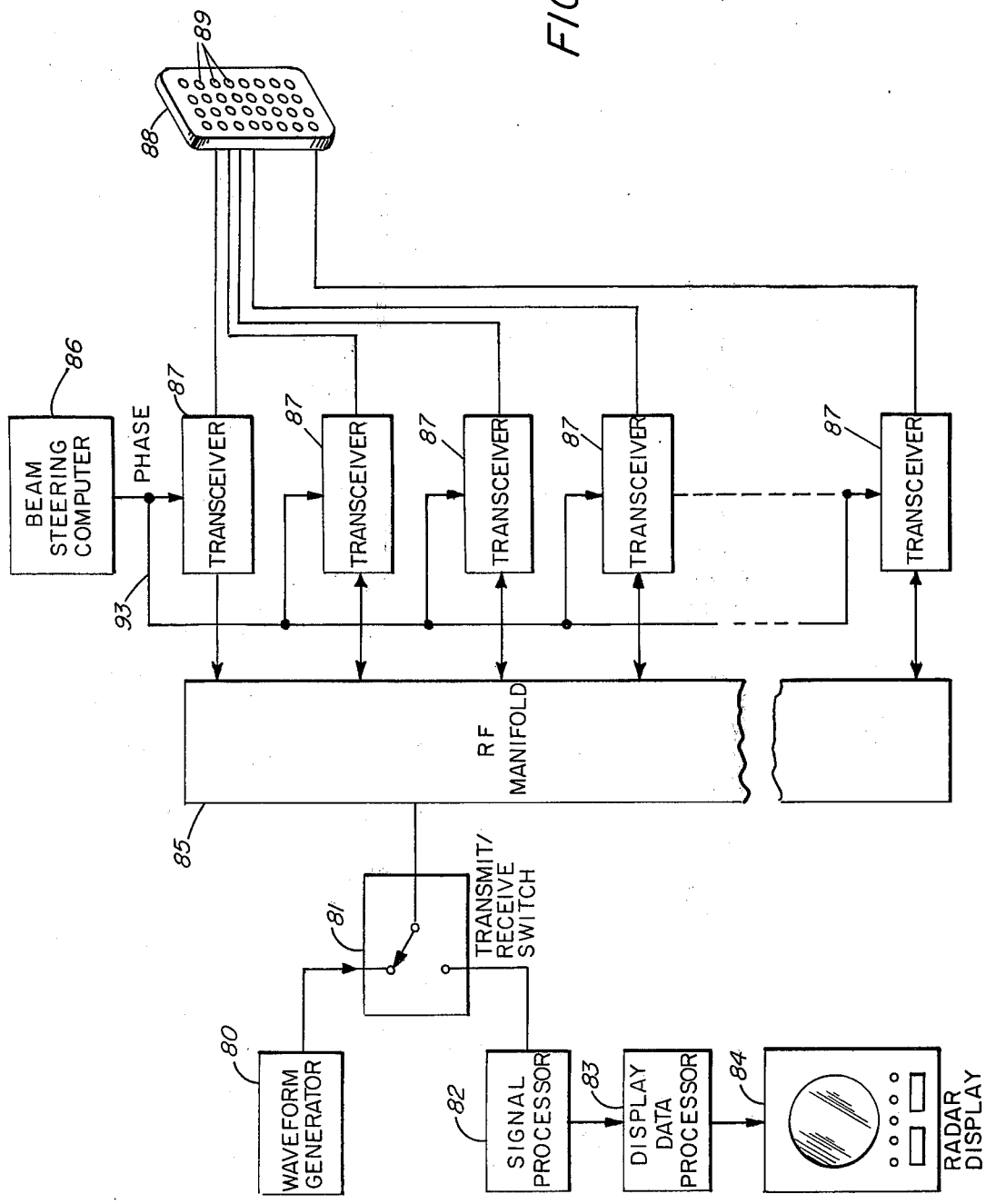

MICROWAVE TRANSISTOR PACKAGE

CROSS-REFERENCE TO RELATED APPLICATIONS

This is a continuation of application Ser. No. 361,731 filed May 18, 1973, now abandoned.

BACKGROUND OF THE INVENTION

Microwave power transistors are used in many applications, such as phased array radars and microwave communication systems. It is therefore desirable to increase the power output and frequency range of such devices without unduly increasing cost. The parasitic inductance of the leads to the transistor chip within the package and stray capacitance among the leads and to ground has been a limiting factor in the frequency response of microwave power transistors. In the past attempts to reduce lead length and thereby lower the inductances and capacitances due to the leads, decreased the maximum size of the transistor chip and the maximum available power output of the device was also correspondingly decreased.

In most microwave power transistors, the transistor chip is supported upon a ceramic substrate such as alumina ($Al_2O_3$) or beryllia (BeO). these ceramic materials are chosen because of their relatively high thermal conductivity and relatively low electrical conductivity. The substrate, which is carefully cut and fit and underlies the entire frame of the transistor package, is mounted on the underlying relatively large thermally and electrically conducting base. In such devices, relatively large amounts of BeO or $Al_2O_3$ were commonly used. Since alumina and beryllia are relatively expensive materials, the resultant device is expensive to fabricate. Achieving a ground connection between the transistor chip around or through the ceramic substrate is also a frequent problem. One method for connecting a ground terminal to the transistor chip is to drill precisely positioned holes through the ceramic substrate, fill the holes with a conducting material such as gold, and then connect the filled holes via a gold metallization pattern on the top of the substrate to the transistor chip. Such approaches commonly involve precise metallization patterns greatly increasing the fabrication costs of the device. On the other hand, if the entire ceramic substrate is metallized and ground connection made through the metallization layer, the path length and, hence, parasitic capacitance and inductance is correspondingly increased for then, the connection had to be made around the edges of the relatively large ceramic substrate. Another problem in present designs is caused by the criticality of the physical dimensions of the ceramic substrate which have to be precisely fitted into the surrounding structure. This also increases the fabrication costs. Impedance matching networks are needed before and after each transistor in a microwave transistor amplifier since, for the most part, the impedance of each transistor varied from that of the circuit in which is was being used. This lack of impedance matching increases the cost, size and complexity of the amplifier.

SUMMARY OF THE INVENTION

Accordingly it is an object of the present invention to increase the maximum power that may be dissipated in a microwave transistor package.

Furthermore, it is an object of the present invention to extend the maximum useful frequency response of a microwave transistor.

Also, it is an object of the present invention to eliminate impedance mismatches between a microwave transistor and its connecting circuitry.

Moreover, it is an object of the present invention to achieve the above-mentioned objects without unduly increasing the cost of the transistor package.

Hence, it is an object of the present invention to decrease the usage of BeO or $Al_2O_3$.

These, as well as other objects may be achieved by providing a pad of electrically insulating, thermally conducting material for supporting a semiconductor device and a flat plate with an aperture in its center wherein the mounting pad is positioned in the center of the aperture. This pad is typically a block of a ceramic material such as BeO or $Al_2O_3$, and the plate is nickel. A copper base is preferably coated with gold and has the mounting pad and the substantially flat apertured plate brazed to it. The package may further comprise an electrically insulating plate which is mounted atop the conductive spacer with an aperture in the center of the insulating plate so that leads may extend to the contact areas on the semiconductor device. This insulated plate includes one or more metallized layers on its surface where the electrical connections may be made on the inside edge to the semiconductor device and on the outside edge to the external leads. An electrically insulating rectangular washer or sealframe is positioned on top of the insulating plate inside of the external leads and surrounding the internal leads to the semiconductor device. A cap is mounted atop the entire combination and is soldered to the top of the sealframe the upper surface of which has previously been coated with gold. This package can be used to advantage with a number of different semiconductor devices including bipolar and field-effect transistors. In the preferred embodiment, each of the contiguous surfaces of the adjacent members which make up the transistor package are hermetically sealed to one another. Impedance varying means such as capacitors may be included within the package and may be mounted upon the substantially flat plate. The device is thereby matched to the impedance of the circuit in which it is used, eliminating the need for external impedance matching elements.

BRIEF DESCRIPTION OF THE DRAWINGS

FIG. 2 is a plan view of the package of FIG. 1 with the top removed;

FIG. 3 is a sectional view of the package shown in FIG. 1;

FIG. 5 is the block diagram of a phased array radar system in which the circuit of FIGS. 4A and 4B is used.

DESCRIPTION OF THE PREFERRED EMBODIMENT

Figure 1:
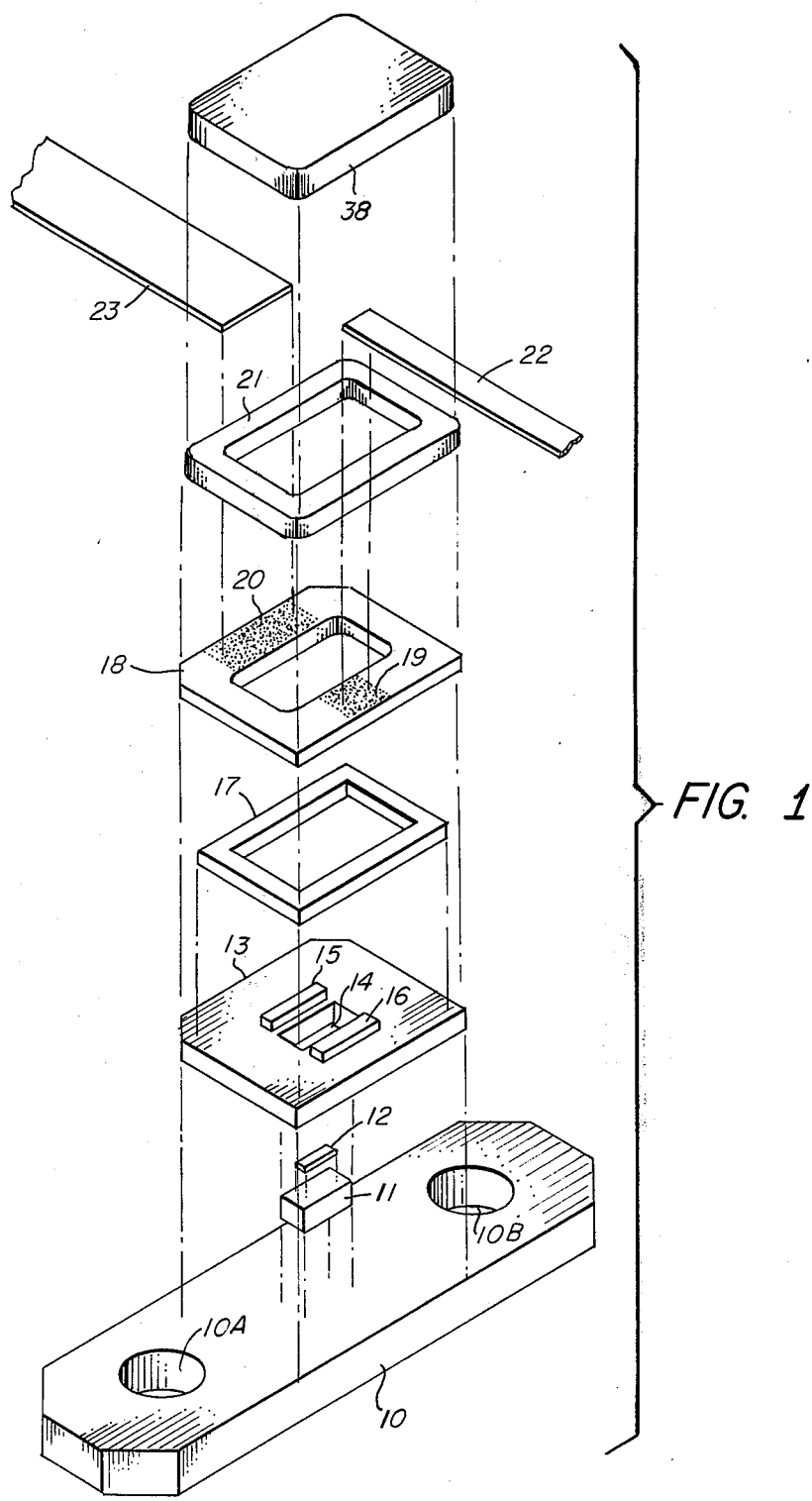
FIG. 1 is an exploded view of a transistor package constructed in accordance with the present invention.

FIG. 1 shows an exploded view of a microwave transistor package constructed in accordance with the teachings of the present invention. Base 10 forms the underlying support for the transistor package. Mounting holes 10A and 10B are used to secure the package to other mounting hardware such as is commonly done in microwave microstrip amplifiers and similar equipment. In the preferred embodiment, the base 10 is made from copper. An apertured plate 13 with the aperture 14 in its center is next hermetically sealed to the base 10. Although a number of different metals could possible be used for this apertured plate 13, nickel is preferred in that it has nearly the same coefficient of expansion as the other package members to which it is in proximity. Molybdenum can also be used since its coefficient of thermal expansion is intermediate that of the copper base 10 and nickel spacer 17 between which the apertured plate 13 is sandwiched. The apertured plate 13 is mounted to the base 10 by brazing with a eutectic Cu-Ag solder. The preferred dimensions of each package member are given below in Table 1.

After the aperture plate 13 has been mounted to the copper base 10, the transistor mounting pad 11 is brazed to the base 10 through the aperture 14 with the eutectic Cu-Ag solder. In the preferred embodiment, the mounting pad 11 is BeO. After the mounting pad 11 has been brazed to the base 10, the apertured plate 13, and the mounting pad 11 are coated with a layer of gold. The transistor mounting pad 11 is preferably dimensioned so that when it is centered in the aperture 14, there will be a small space between it and all sides of the apertured plate 13.

The small size of the BeO pad used in the present invention is in marked contrast to the dimensions of BeO or Al$_2$O$_3$ used in other microwave transistor packages where the ceramic insulator underlies the entire packaging structure. The reduced use of BeO not only reduces considerably the overall cost of the package but it also reduces the number of operations which need be performed with the BeO or Al$_2$O$_3$ to construct the package. For example, in the past, a BeO substrate had to be cut to a quite precise shape and precise metallization patterns had to be deposited upon the surface with plated metal through holes drilled through it. Besides the expense, these extra operations involve hazards to the personnel performing the operations in that BeO, especially in powdered form, is a toxic substance. In the present embodiment, a tolerance of only 0.005 inches is all that need be maintained on the linear dimensions of the BeO mounting pad 11 and no holes need be drilled through it.

After the transistor mounting pad 11 has been brazed to the copper base 10, the transistor chip 12 is mounted atop the mounting pad 11. This is accomplished by heating to 400°C (below the melting point of either gold or silicon) and applying pressure between the transistor chip 12 and mounting pad 11 while moving the transistor chip back and forth. A eutectic gold to silicon bond is thus formed. This transistor chip 12 may be any of a number of different devices including bipolar and FET microwave transistor devices. For example, one such transistor device is described in copending application Ser. No. 301,555 which shows a bipolar microwave transistor structure which may be used advantageously with the present invention. Connections to one of the active elements of the transistor chip 12 can be made through the gold coating on the top of the transistor mounting pad 11 to the bottom of the chip 12. In the preferred embodiment, the collector lead is so connected.

Figure 6:
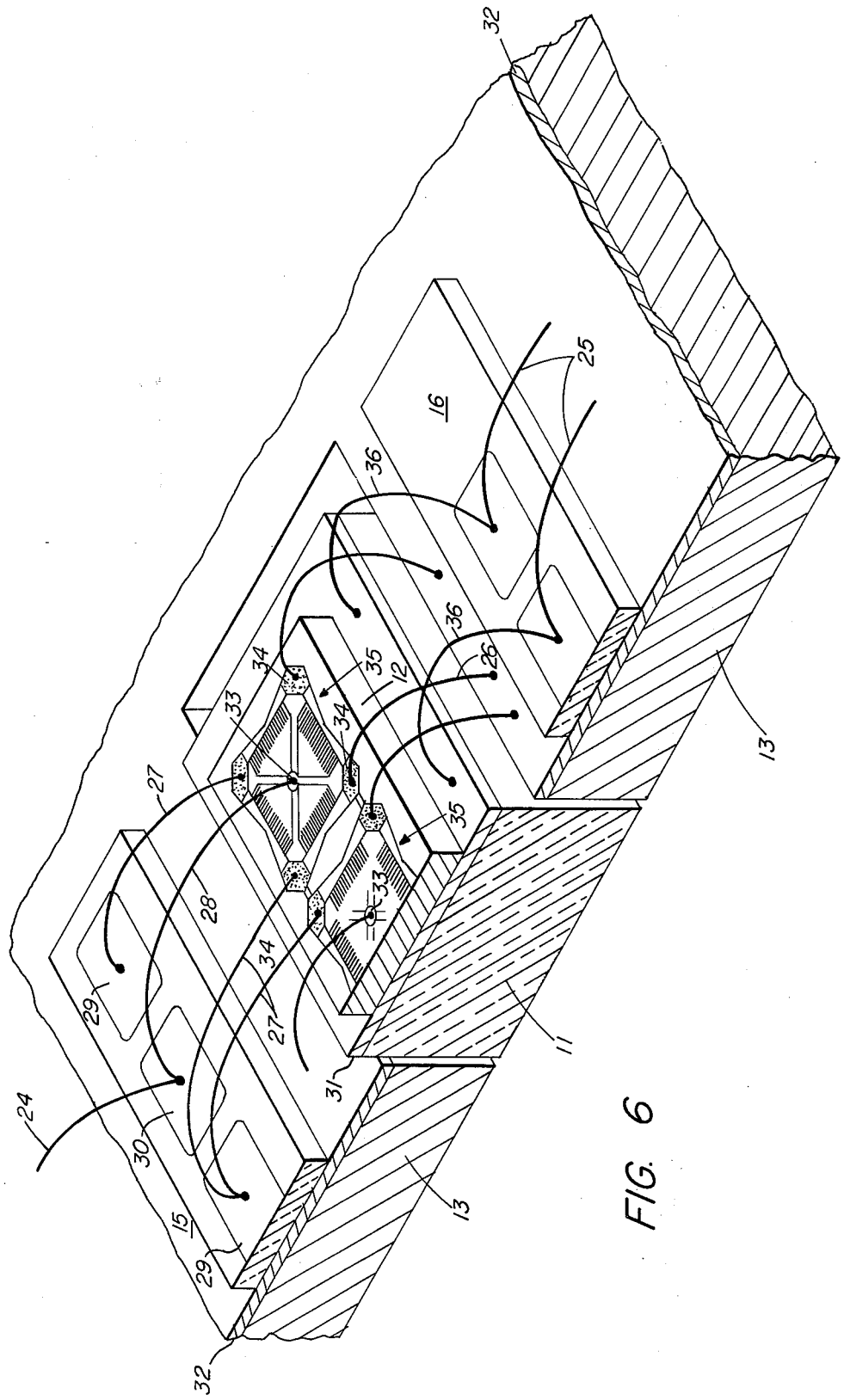
FIG. 6 is an enlarged sectioned isometric view of the region in the center of the device of FIG. 1.

Details of the external connections to the other active elements of the transistor are shown in detail in connection with FIGS. 2 and 6. Also shown in these figures are two banks 15 and 16 of miniature MOS capacitors which are used to match the impedances of the transistor chip to the incoming leads. These capacitor banks 15 and 16 are mounted on the top surface of apertured plate 13. Several of these banks can be used as desired and other components may be mounted upon the top surface of the apertured plate 13. It is to be noted that much larger transistor chips can be accommodated in the present invention than was previously possible because of the ample room available within the package.

A nickel spacer 17 is mounted on the top surface of the apertured plate 13. The spacer 17 is used to position the insulating plate 18 and external leads 22 and 23 at the appropriate height above the transistor chip 12. This nickel spacer 17 is hermetically sealed around apertured plate 13 by brazing with eutectic Cu-Ag solder. On top of the nickel spacer 17 and hermetically sealed by brazing to it is an insulating plate 18 preferably composed of Al$_2$O$_3$. The underside of the insulating plate 18 is coated with a layer of gold over a layer of silver as are areas 19 and 20 which provide a contact area for external leads 22 and 23. The ends of these leads 22 and 23 extend approximately half way across the gold metallization areas 19 and 20. Additional leads, for example at the sides, can be added in the same manner. Al$_2$O$_3$ frame 21, generally rectangular in shape with rounded corners, fits around the aperture in the insulating plate 18 between the ends of leads 22 and 23. The frame 21 and insulating plate 18 may be joined either with glass or by heating them together until the Al$_2$O$_3$ liquifies and flows between them. The top surface of frame 21 is plated with gold over a layer of silver in the preferred embodiment to facilitate making the hermetic seal to cap 24. Cap 24, made of gold plated copper in the preferred embodiment, completes the hermetically sealed package.

FIG. 2 shows a plan view of the device shown in FIGS. 1 and 3 wherein the connections between the internal and external leads and the transistor chip are shown in detail. The connections illustrated are possible connections for the transistor device shown in FIG. 4 of copending application Ser. No. 301,555 although this device is used by way of illustration only as any number of different lead connections may be used depending upon the type of transistor chip used with the package. FIG. 6 shows an enlarged isometric view of a portion of these connections and will be discussed herein along with FIG. 2.

In each of the three transistor sections 35 of the transistor chip 12, the emitter connection for all of the emitters of the transistors in that transistor section 35 is located at the center of the section at metal emitter connection pad 33. A gold plated copper lead 28 extends from each of these emitter connection pads 33 in an arch to the emitter lead capacitors 30 within MOS capacitor bank 15. The capacitor between the emitter lead and bare lead, which is normally grounded in amplifier use, is formed through the metal oxide between the capacitor pad 30 and the gold plating 32 of the apertured plate 13. From the capacitor pad 30, leads 24 connect the emitters to metallized layer 20 which is in turn bonded to the external emitter lead 23. Similarly for the base leads, there are four base connection pads 34 for each section of transistors within the transistor chip 12. On one side of transistor chip 12, these base pads are connected to MOS capacitors 29 through gold plated copper leads 27. On the other side of the transistor chip 12, the base leads are connected directly through gold plated copper leads 26 to base 13 through gold layer 32 on base 13 which is in turn preferably connected to ground in the circuit in which the transistor is used. The collector lead from the transistor chip 12 is brought out through the underside of the transistor chip 12 as discussed in the aforementioned copending application. It is thus connected to the gold layer 31 on the mounting pad 11 which is connected through gold plated copper leads 36 to MOS capacitor 37 of capacitor bank 16 and then through gold plated copper leads 25 to the external collector lead 22. It is, of course, understood that this particular arrangement of capacitors is by way of illustration only and that numerous other arrangements and devices other than MOS capacitors may be used within the transistor package in accordance with the present invention to match the impedance of the transistor to that of the circuit.

Figure 4A:
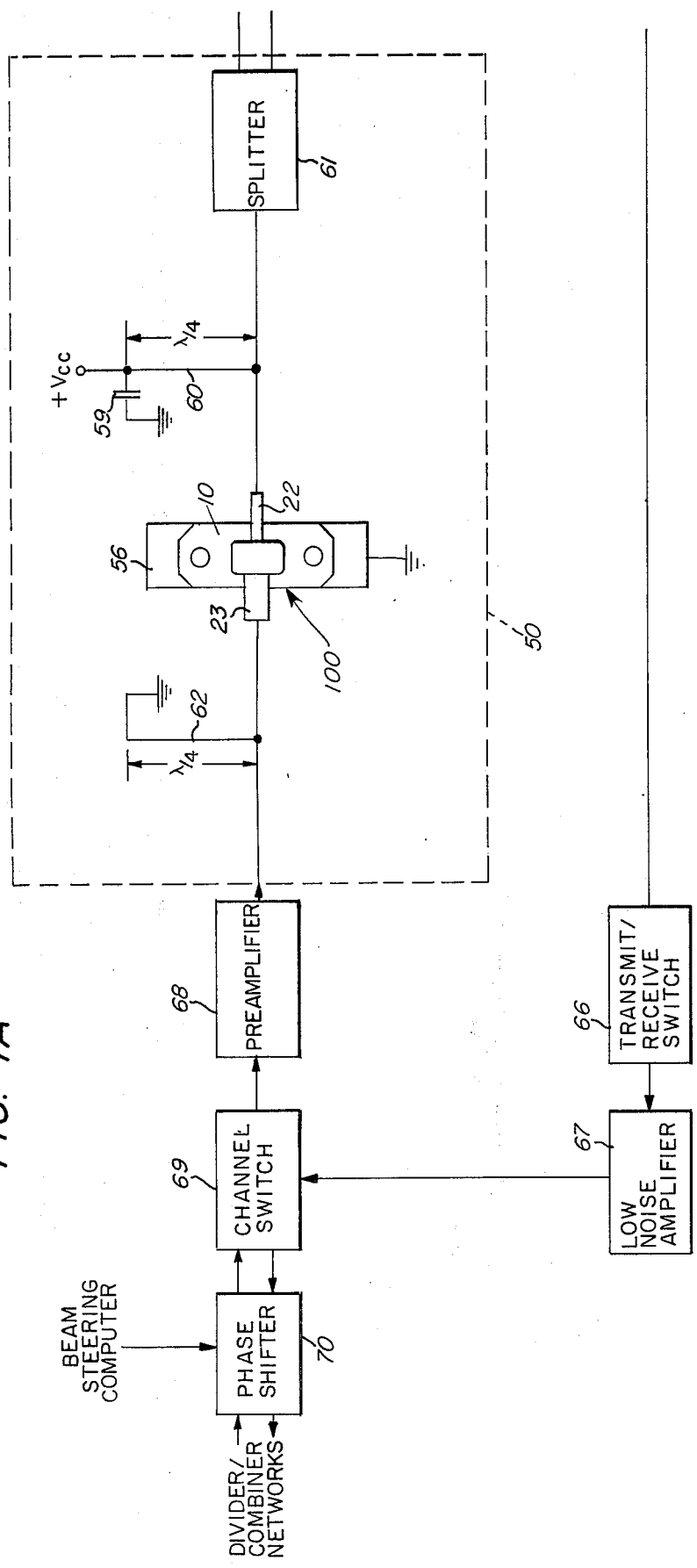
FIGS. 4A and 4B are a circuit diagram of a portion of a phased array radar system in which the present invention is used to advantage.
Figure 4B:
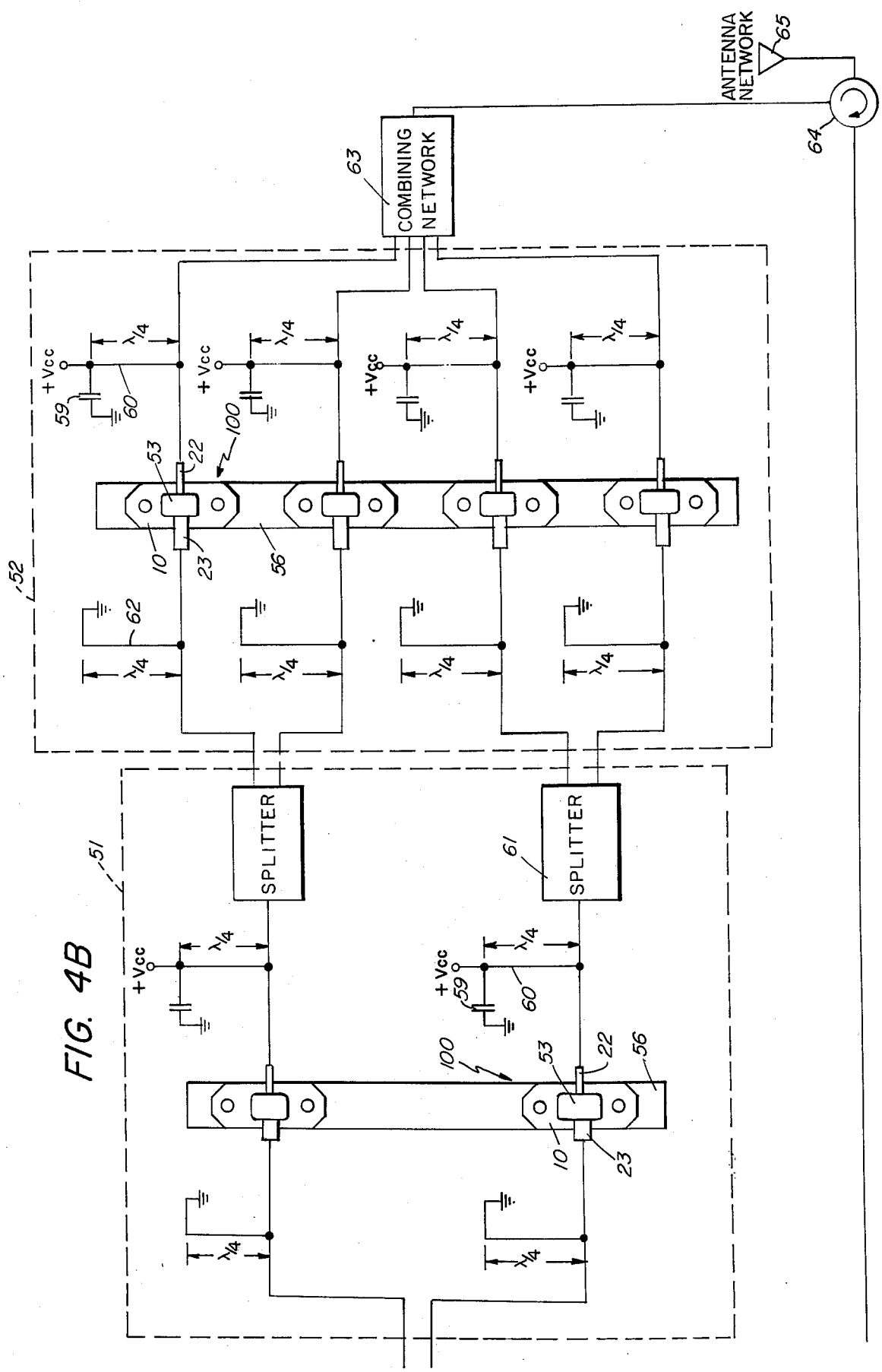

FIG. 5 shows a simplified block diagram of a phased array radar system in which the circuit of FIGS. 4A and 4B, incorporating the present invention, is employed to advantage. When the system is in the transmitting mode, as the switch is positioned in the drawing, the transmit/receive switch 81 connects the waveform generator 80 to the RF manifold 85. The waveform generator 80 may supply, for example, a chirped pulse of 20 sec. duration with a 1 gHz carrier frequency and with linear frequency modulation. The RF manifold 85 distributes the pulse to the inputs of transceivers 87. There is one such transceiver for each antenna element 89 within the phased array antenna 88. Typically, there may be from 2500 to 10,000 elements in an antenna. Lines 93 couple the output of beam steering computer 86 to each transceiver 87 for computer control of the phase delay at each transceiver 87. In operation, a pulse is transmitted towards a target and a return pulse is reflected back from the target to the antenna 88. The transceivers are switched into the receiving mode with the same relative phase delay for each transceiver as was set for the transmitting mode so that the system is pointed for both transmitting and receiving modes of operation in the same direction.

It is to be noted that with the present invention no feedback is required to stabilize the phase delay at each transceiver. Furthermore, the phase shifting may be effected before final amplification thereby eliminating the need for bulky and expensive ferrite phase shifters which have been used to shift phase at relatively high power levels in phased array radar systems employing traveling wave tubes for amplifiers.

In FIGS. 4A and 4B are shown the circuit diagram of each transceiver 87 of FIG. 6 employing a microwave transistor device constructed in accordance with the present invention. When the module shown in FIGS. 4A and 4B is in the transmitting mode, the unamplified input signal is connected from a divider/combiner network source, which is common to all transceiver circuits, to the input of phase shifter 70. The desired phase of the signal is set with the phase shifter 70 which is preferably a series combination of delay elements which may be switched in and out selectively by the external beam steering computer. A channel switch 69 couples the phase shifted unamplified signal to a preamplifier 68. The preamplifier 68, which is preferably operated as a Class A linear amplifier, boosts the signal prior to final amplification.

Three stages of final amplification are shown generally at 50, 51 and 52. Transistor device 100 in the first stage 50 drives two transistor devices 100 in the second stage 51 and each of the two transistor devices 100 in the second stage 51 drives two transistor devices 100 in the third stage 52. All of the transistor devices 100 in the three stages 50, 51 and 52 are preferably operated in Class C. The quarter wavelength tuning stub 62 detunes signals at frequencies other than the center frequency of the signal being amplified. It is to be noted that here no matching networks are required between stages since the transistors are internally matched. Transistor device 100 is operated in a common base configuration in each stage with the base connection made through mounting base 10. Mounting base 10 may preferably be connected with screws to a grounding strip 56. A second quarter wavelength tuning stub is used to connect a DC bias voltage Vcc to the collector since a quarter wavelength line appears as an open circuit to the signal. A bypass capacitor 59 acts as a connection to ground for the high frequency signal. The splitter 61 divides the amplified signal from the first stage 50 equally as to both phase and amplitude and couples the two new signals thus obtained to the two transistor devices 100 in the second stage 51. The same circuit arrangement is used in the second stage 51 and third stage 52 as in the first stage 50. The output signals from the four transistor devices 100 in the third stage 52 are added together in phase by combiner 63 and coupled to the antenna element 65 through a microwave circulator 64.

When the module is in the receiving mode, signals which have been transmitted and reflected from some distant object back to the antenna are coupled from the antenna element 65 by the microwave circulator 64 through a transmit/receive switch 66. This switch is in an open circuit condition to prevent excessive energy from reaching and damaging low noise amplifier 67 when the module is in the transmitting mode. Channel switch 69 routes the amplified return signal back through phase shifter 70 and hence back to the divider and combiner networks for processing along with return signals from other antenna elements within the phased array radar system.

TABLE 1

| MEMBER | LENGTH | WIDTH | THICKNESS | LENGTH OF APERTURE | WIDTH OF APERTURE |
|---|---|---|---|---|---|
| Mounting Pad 11 | .085 | .035 | .035 | — | — |
| Apertured Plate 13 | .325 | .250 | .025 | .090 | .040 |
| Base 10 | .900 | .250 | .065 | — | — |
| Spacer 17 | .305 | .202 | .015 | .260 | .160 |

TABLE 1-continued

| MEMBER | LENGTH | WIDTH | THICKNESS | LENGTH OF APERTURE | WIDTH OF APERTURE |
|---|---|---|---|---|---|
| Insulating Plate 18 | .325 | .250 | .020 | .240 | .110 |
| Sealframe 21 | .325 | .190 | .030 | .275 | .150 |
| Cap 24 | .325 | .190 | — | — | — |

All above dimensions are in inches.

Additionally, metallized region 20 has a length of 0.180 inches and metallized region 19 has a length of 0.060 inches. All layers of silver are 50 microns thick and all layers of gold are 100 microns thick.

This concludes the description of the preferred embodiment. Although a description of the preferred embodiment has been made, numerous modifications and alterations thereto would be apparent to one skilled in the art without departing from the spirit and scope of the present invention. In particular, the dimensions given for the preferred embodiment are by way of illustration only. Other dimensions may be used as required for other transistor chips and lead arrangements.

What is claimed is:

1. A semiconductor device comprising in combination:
    a thermally and electrically conducting base member;
    an electrically conducting planar member coupled to said base member, said planar member having an aperture therein;
    a thermally conducting, electrically insulating support for a semiconductor body, said support having upper and lower surfaces, said support being positioned in said aperture of said planar member, said lower surface being coupled to said base member, and said upper surface having a conductive coating thereon; and
    at least one lead for electrically coupling said conductive coating to said base member through said planar member, one end of said lead being coupled to said conductive coating and the other end of said lead being coupled to the surface of said planar member.

2. The combination of claim 1 further comprising said semiconductor body, said semiconductor body being mounted on said conductive coating and said semiconductor body having an active element electrically coupled to said conductive coating.

3. The combination of claim 2 further comprising in combination:
    impedance matching means, said impedance matching means being mounted upon said planar member; and
    a plurality of leads for coupling elements of said semiconductor body to said impedance matching means.

4. The combination of claim 3 further comprising in combination:
    an electrically conducting spacer mounted upon said planar member;
    an electrically insulating plate having an aperture therein, said plate being mounted upon said spacer, said plate having at least one metallized region for making electrical connection with elements of said semiconductor body;
    an electrically insulating sealframe, said sealframe being mounted upon said insulating plate; and
    a planar top, said top being mounted upon said sealframe.

5. The combination of claim 4 further comprising in combination:
    a plurality of leads for connecting elements of said semiconductor body to said metallized regions; and
    a plurality of external leads for coupling said semiconductor device to utilization means.

6. The combination of claim 5 wherein said package is hermetically sealed.

7. A semiconductor device package comprising in combination:
    a thermally and electrically conducting base member;
    an electrically conducting planar member electrically coupled to said base member, said planar member having an aperture therein; and
    a thermally conducting, electrically insulating support for a semiconductor body, said support having upper, lower, and side surfaces, such support being positioned in said aperture, said lower surface being coupled to said base member, said upper surface having a conductive coating thereon, and said side surfaces being everywhere laterally adjacent electrically conductive surfaces.

8. The combination of claim 7 further comprising said semiconductor body.

9. The combination of claim 8 further comprising in combination:
    impedance matching means, said impedance matching means being mounted upon said planar member; and
    a plurality of leads for coupling elements of said semiconductor body to said impedance matching means.

10. The combination of claim 9 further comprising in combination:
    an electrically conducting spacer mounted upon said planar member;
    an electrically insulating plate having an aperture therein, said plate being mounted upon said spacer, said plate having one or more metallized regions for making electrical connection with elements of said semiconductor body;
    an electrically insulating sealframe, said sealframe being mounted upon said insulating plate; and
    a planar top, said top being mounted upon said sealframe.

* * * * *